(12) United States Patent
Bae et al.

(10) Patent No.: US 11,316,059 B2
(45) Date of Patent: Apr. 26, 2022

(54) THERMAL RADIATION BODY FOR COOLING HEATING ELEMENT AND METHOD FOR MANUFACTURING THE SAME

(71) Applicants: Hexasolution Co., Ltd., Suwon-Si (KR); UNIVERSITY-INDUSTRY COOPERATION GROUP OF KYUNG HEE UNIVERSITY, Yongin-Si (KR)

(72) Inventors: Duk Kyu Bae, Yongin-Si (KR); Sung Hee Kim, Yongin-Si (KR); Ka Youn Kim, Hwaseong-Si (KR); Sun Kyung Kim, Suwon-Si (KR); Jin Woo Cho, Yongin-Si (KR)

(73) Assignees: Hexasolution Co., Ltd.; UNIVERSITY-INDUSTRY COOPERATION GROUP OF KYUNG HEE UNIVERSITY

( * ) Notice: Subject to any disclaimer, the term of this patent is extended or adjusted under 35 U.S.C. 154(b) by 0 days.

(21) Appl. No.: 16/457,899

(22) Filed: Jun. 28, 2019

(65) Prior Publication Data
US 2020/0259032 A1 Aug. 13, 2020

(51) Int. Cl.
*H01L 31/052* (2014.01)
*H01L 33/64* (2010.01)
(Continued)

(52) U.S. Cl.
CPC .... *H01L 31/0521* (2013.01); *H01L 31/02168* (2013.01); *H01L 31/0543* (2014.12); *H01L 31/0547* (2014.12); *H01L 31/12* (2013.01); *H01L 31/18* (2013.01); *H01L 33/005* (2013.01); *H01L 33/46* (2013.01); *H01L 33/642* (2013.01); *H01L 33/648* (2013.01)

(58) Field of Classification Search
CPC ..... H01L 23/36; H01L 23/367; H01L 23/373; H01L 23/3731; H01L 31/024; H01L 31/052; H01L 31/0521; H01L 31/0525; H01L 33/64; H01L 33/642; H01L 33/644; H01L 45/1286; H01L 51/529; H01L 23/3733; H01L 33/641; H02S 40/42
See application file for complete search history.

(56) References Cited

U.S. PATENT DOCUMENTS 3,232,795 A * 2/1966 Gillette .................. F24S 25/15
136/246
8,537,554 B1 * 9/2013 Hockaday ........... H01L 31/0521
361/713

(Continued)

FOREIGN PATENT DOCUMENTS

JP 2018143025 A 9/2018
JP 6437702 B2 12/2018

(Continued)

*Primary Examiner* — Shih Tsun A Chou
*Assistant Examiner* — Peter M Albrecht
(74) *Attorney, Agent, or Firm* — Renaissance IP Law Group LLP

(57) ABSTRACT

The present inventive concept relates to a thermal radiation body for cooling a heating element, which includes a pattern unit including a pore part provided as an empty space or filled with a gas phase and a cover part covering the pore part and dissipates heat of the heating element through heat radiation.

12 Claims, 8 Drawing Sheets

(51) Int. Cl.
*H01L 33/00* (2010.01)
*H01L 33/46* (2010.01)
*H01L 31/054* (2014.01)
*H01L 31/12* (2006.01)
*H01L 31/18* (2006.01)
*H01L 31/0216* (2014.01)

(56) References Cited

U.S. PATENT DOCUMENTS

2017/0117451 A1* 4/2017 Matsumoto ......... H01L 23/3737
2017/0297750 A1* 10/2017 Liu ....................... B64G 1/503
2020/0198114 A1* 6/2020 Suzuki ................... B25F 5/008

FOREIGN PATENT DOCUMENTS

| KR | 20100126179 A | 12/2010 |
| KR | 101025564 B1 | 3/2011 |
| KR | 20170125438 A | * 11/2017 |
| KR | 20170125438 A | 11/2017 |

* cited by examiner (a)

(b)

(a)

(b)

(c)

THERMAL RADIATION BODY FOR COOLING HEATING ELEMENT AND METHOD FOR MANUFACTURING THE SAME

CROSS-REFERENCE TO RELATED APPLICATION

This application claims priority to Korean Patent Application No. 10-2019-0016880 filed on Feb. 13, 2019, and all the benefits accruing therefrom under 35 U.S.C. § 119, the contents of which are incorporated by reference in their entirety.

BACKGROUND

The present disclosure relates to a thermal radiation body for cooling a heating element and a method for manufacturing the same, and more particularly, a thermal radiation body for cooling a heating element, which dissipates heat of the heating element by thermal radiation.

Generally, in photovoltaic power generation, a heat dissipation module for cooling heat generated from heating elements is assembled with a solar cell module that absorbs solar light to convert the solar light into electric energy or the heating elements such as a light emitting diode (LED) used as a light source and electronic components. The heat generated from the heating element may be transferred to the heat dissipation module in a thermal conductive manner. The heat conducted to the heat dissipation module may be released again to the outside to cool the heating element.

According to the related art, the heat transferred from the heating element in a conduction, convection, or phase transition manner except for the radiation among the four heat transfer manners (conduction, radiation, convection, and phase transition) may be released to the outside. As a result, there is a problem in that heat releasing efficiency of the heating element by the heat dissipation module is deteriorated.

That is, since it is a limitation in releasing the heat generated from the heating element to the outside in the conduction, convection, and phase transition manners, there is a demand for a method for more effectively dissipating the heat of the heating element.

SUMMARY

The present inventive concept provides a thermal radiation body for cooling a heating element, which releases heat of the heating element to the outside by thermal radiation to improve cooling efficiency, and a method for manufacturing the same.

In accordance with an exemplary embodiment, a thermal radiation body for cooling a heating element according to an embodiment of the present inventive concept includes a pattern unit configured to radiation-release heat transferred from the heating element, to an outside, wherein the pattern unit includes: a pore part disposed on the heating element and provided as an empty space or filled with a gas phase; and a cover part of which at least a portion is thermally connected to the heating element and which covers the pore part to define an area of the pore part.

The pattern unit may be provided in the form of a plurality of unit patterns spaced apart from each other.

The thermal radiation body may further include a reflection layer provided between a surface of the heating element and the pattern unit, to reflect light incident into the surface of the heating element from the outside.

The thermal radiation body may further include an anti-reflection layer provided between a surface of the heating element and the pattern unit, to prevent reflection of light incident into the surface of the heating element from inside the heating element or the outside.

The cover part may include: a first cover part contacting the pore part; and a second cover part provided on the first cover part and made of a material different from that of the first cover part.

The first cover part and the second cover part may be made of ceramic materials having light absorptivity different from each other in a predetermined wavelength band.

The cover part may have a thickness of 50 nm to $\lambda/n$ (where $\lambda$ is a peak wavelength of the light radiated from the pattern unit, and $n$ is a refractive index of the cover part at the peak wavelength).

A wavelength radiation-emitted from the pattern unit may be an infrared wavelength.

The thermal radiation body may further include a base layer provided on the pattern unit to support or protect the pattern unit.

The pore part may be formed by removing a sacrificial layer pattern covered by the cover part through heat treatment or wet etching.

In accordance with another exemplary embodiment, an electronic device according to another embodiment of the present inventive concept includes a heating element that is an electronic element; and the thermal radiation body for cooling the heating element according to an embodiment of the present inventive concept.

The thermal radiation body for cooling the heating element may be directly formed on the heating element or may be attached to be fixed to the heating element.

The electronic element may include a light receiving element, and the cover part may be transmissive with respect to a wavelength band of light absorbed by the light receiving element.

The electronic element may include a light emitting element, and the cover part may be transmissive with respect to a wavelength band of light emitted from the light emitting element.

In accordance with another exemplary embodiment, a method for manufacturing a thermal radiation body for cooling a heating element according to further another embodiment of the present inventive concept includes: forming a sacrificial layer pattern on a substrate; forming a cover part on the sacrificial layer pattern; and removing the sacrificial layer pattern.

In the removing of the sacrificial layer pattern, the sacrificial layer pattern may be removed by performing heat treatment under oxygen atmosphere or wet etching.

The forming of the cover part may include: depositing a first cover part on the sacrificial layer pattern; and depositing a second cover part on the first cover part by using a ceramic material different from that of the first cover part.

In accordance with another exemplary embodiment, a method for manufacturing a thermal radiation body for cooling a heating element according to further another embodiment of the present inventive concept includes: forming a sacrificial layer pattern on a substrate; forming a cover part on the sacrificial layer pattern; forming a transfer film on the cover part; and removing the substrate and the sacrificial layer pattern at the same time or in sequence.

The forming of the cover part may include: depositing a first cover part on the sacrificial layer pattern; and depositing a second cover part on the first cover part by using a ceramic material different from that of the first cover part.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
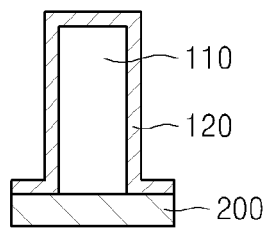
FIG. 1 is a cross-sectional view illustrating a thermal radiation body for cooling a heating element in accordance with an exemplary embodiment.

Hereinafter, specific embodiments will be described in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. In the descriptions, the same elements are denoted with the same reference numerals. In the figures, the dimensions of layers and regions are exaggerated for clarity of illustration. Like reference numerals refer to like elements throughout.

Figure 2:
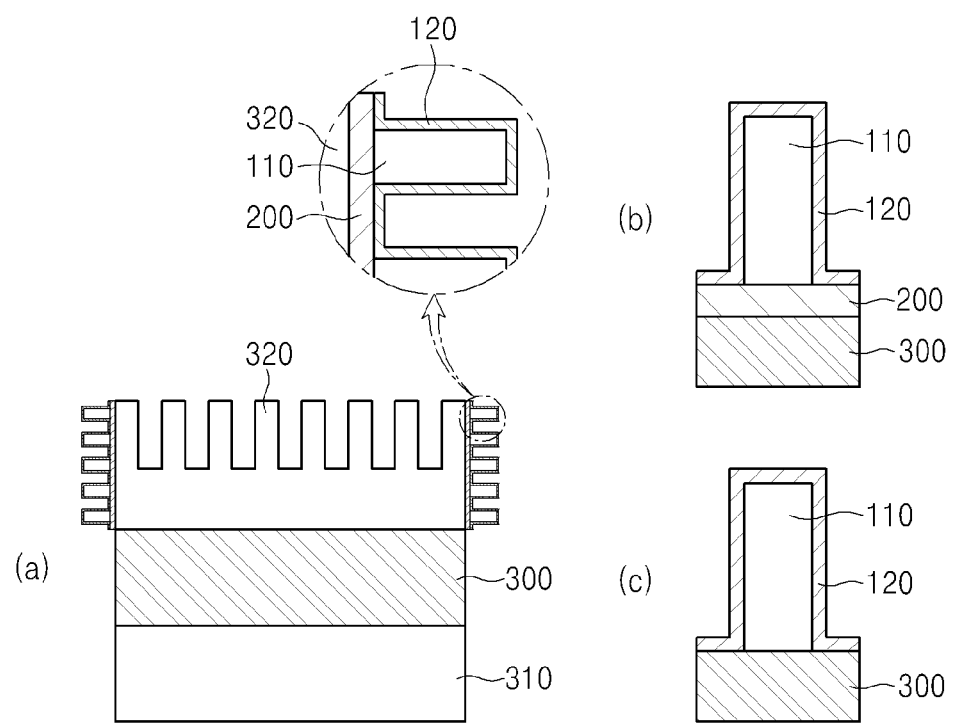
FIG. 2 is a cross-sectional view for explaining heat dissipation of the heating element by using the thermal radiation body for cooling the heating element in accordance with an exemplary embodiment.

FIG. 1 is a cross-sectional view of a thermal radiation body for cooling a heating element according to an embodiment of the present inventive concept, and FIG. 2 is a cross-sectional view for explaining heat dissipation of the heating element by using the thermal radiation body for cooling the heating element according to an embodiment of the present inventive concept. (a) of FIG. 2 illustrates a thermal radiation body for cooling a heating element according to an embodiment, (b) of FIG. 2 illustrates a thermal radiation body for cooling a heating element including a base layer, and (c) of FIG. 2 illustrates a thermal radiation body for cooling a heating element, on which a pattern unit is directly formed on the heating element.

Referring to FIGS. 1 and 2, the thermal radiation body for cooling the heating element according to an embodiment of the present inventive concept may include a pattern unit configured to radiation-release heat transferred from the heating element, to an outside, wherein the pattern unit may include: a pore part 110 disposed on the heating element 300 and provided as an empty space or filled with a gas phase; and a cover part 120 of which at least a portion is thermally connected to the heating element 300 and which covers the pore part 110 to define a region of the pore part 110.

The pattern unit may radiate heat transferred from the heating element 300, to the outside, to release the heat in the form of radiation. For example, the pattern unit may be formed on a cooling fin 320 assembled with the heating element 300 together with the base layer 200 provided between the pattern unit and the heating element 300 as illustrated as FIG. 2(a), may be formed to directly contact a surface of the heating element 300 together with the base layer 200 as illustrated in FIG. 2(b), or directly formed on the surface of the heating element through a transfer process that will be described below as illustrated in FIG. 2(c). That is, the pattern unit may be formed or attached on a surface of the heating element 300 and/or a constituent assembled with the heating element 300 such as the cooling fin 320. The pattern unit may directly contact the heating element 300 or thermally indirectly contact the heating element 300.

The pattern unit may receive heat generated in the heating element 300 to radiation-release the heat to the outside and be provided on one surface of the heating element 300, which generates heat, to improve the heat releasing efficiency (i.e., light radiation efficiency).

The pore part 110 may be disposed on the heating element 300 and be provided as an empty space or filled with a gas phase. The pore part 110 may be provided in the cover part 120 that is provided as the form of a wall and has a thin thickness. The pore part 110 may be formed on a surface of a substrate 100 for forming the pattern unit or a surface of the heating element 300 in an outward direction. As illustrated in FIG. 1, the pore part 110 may have a line shape extending in an x-axis or y-axis direction as well as a rectangular pillar shape. In addition, the pore part 110 may have various shapes such as a cone shape, a cylinder shape, a triangular pyramid shape, a pyramid shape, and the like.

The cover part 120 may cover the pore part 110 to define a region of the pore part 110, and at least a portion of the cover part 120 may be thermally connected to the heating element 300. At least a portion of the cover part 120 may directly contact the heating element 300 or may be indirectly connected to the heating element 300 through a base layer 200, a reflection layer 140, or an antireflection layer 130 so that the pattern unit that is structurally stable is disposed on the heating element 300 to receive the heat generated from the heating element 300, thereby realizing the heat transfer.

According to the related art, a cooling fin 320 made of superior thermal conductivity such as a metal is formed on the heating element 300 to dissipate heat. In this case, the cooling fin 320 may receive the heat from the heating element 300 through the conduction to dissipate the heat in only a manner in which the cooling fin 320 is heat-exchanged with air through convection. In general, the metal has superior thermal conductivity, but has a low emissivity. Thus, there is a limitation in improving a heat releasing effect and a cooling effect through radiation.

However, according to the present inventive concept, the cover part 120 may be made of a material (for example, a ceramic material or a dielectric) that is capable of releasing the heat in the form of radiation energy due to a high emissivity so that the thermal radiation is performed in the pattern unit.

In general, the emissivity has the same value as the absorptivity in the same wavelength (Kirchhof's Law of Thermal Radiation). Thus, a method for increasing in thickness of the material to increase in absorptivity so as to obtain the high emissivity is generally attempted. However, according to the present inventive concept, the pattern unit may include the pore part 110 to generate an optical tunneling effect due to the pore part 110 together with a resonant effect due to the pattern, thereby increasing the absorptivity of the pattern unit even with the thin thickness of the cover part 120. As a result, a thermal radiation amount depending on (or proportional to) the absorptivity may increase.

When the thickness of the material having the absorption property is less than a wavelength of light, reflection of the light incident into the surface of the material may be reduced to increase in absorptivity of the light passing through the inside of the material. Here, this is called an absorption enhancement effect.

In general, a wavelength emitted from the heating element 300 such as a solar cell module, a light emitting element, and an electronic component may be a near-infrared or a middle infrared wavelength band. When a temperature of the heating element 300 is determined, a radiation spectrum emitted according to the temperature may be determined.

That is, there is a wavelength band or a radiation spectrum radiated in accordance with the temperature of the heating element 300. Thus, when the material (for example, the ceramic material) having a maximum emissivity in a wavelength corresponding to the radiation spectrum of the heating element 300 having a predetermined heat-generating temperature is used to form the pattern unit on the heating element 300, the cooling effect of the heating element 300 may be more improved.

Figure 3:
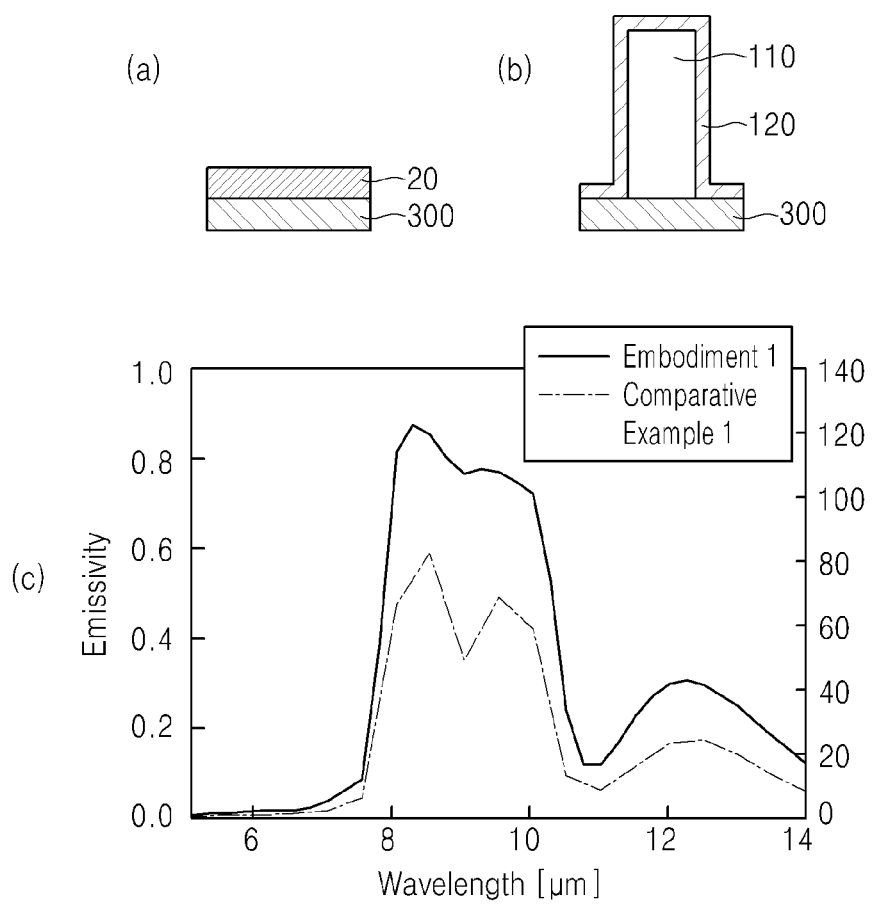
FIG. 3 is a graph illustrating an emissivity depending on a wavelength in accordance with an exemplary embodiment.
Figure 4:
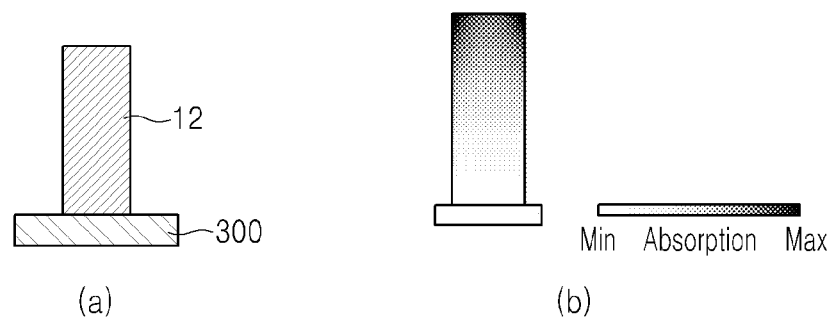
FIG. 4 is a graph illustrating an emissivity depending on a wavelength in accordance with an exemplary embodiment.
Figure 4:
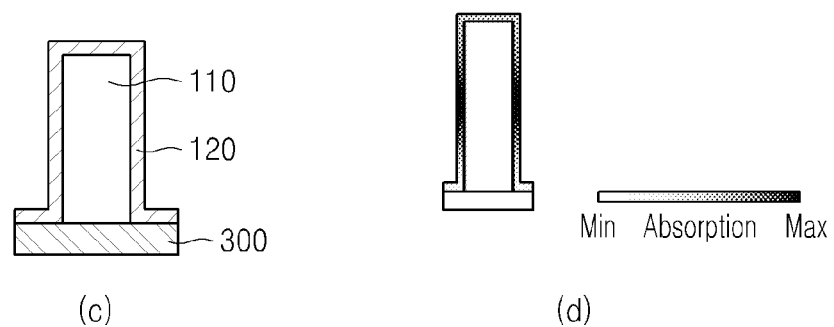
Figure 4:
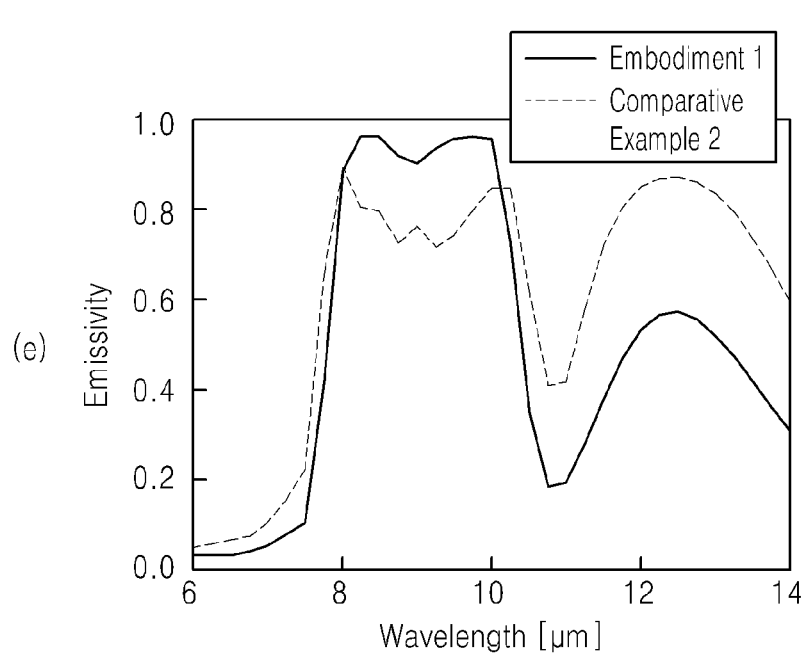

FIG. 3 is a graph illustrating an emissivity depending on a wavelength according to an embodiment of the present inventive concept. Here, (a) of FIG. 3 is a view of a structure in which a planar structure made of the ceramic material is formed on the surface of the heating element according to Comparative Example 1, (c) of FIG. 3 is a graph illustrating emissivities according to Embodiment 1 and Comparative example 1. FIG. 4 is a graph illustrating an emissivity depending on a wavelength according to an embodiment of the present inventive concept. Here, (a) of FIG. 4 is a view of a structure in which the pore part is not formed according to Comparative Example 2, (b) of FIG. 4 is a view illustrating absorption distribution of light according to Comparative Example 2, (c) of FIG. 4 is a view of a structure in which the pore part is formed according to Embodiment 1, (d) of FIG. 4 is a view illustrating absorption distribution of light according to Embodiment 1, and (e) of FIG. 4 is a graph illustrating emissivities according to Embodiment 1 and Comparative Example 2.

Referring to FIGS. 3 and 4, the pattern unit constituted by the pore part 110 and the cover part 120 may be provided on the heating element 300 to significantly increase in emissivity in the infrared wavelength band when compared to Comparative Examples in which the pattern unit is not provided on the heating element 300. That is, a black body may be an object having the most ideal radiation characteristics, and the pattern unit may be formed on the heating element 300 to increase in radiation amount in a specific wavelength or wide infrared wavelength band. Thus, the radiation amount may increase to exhibit a radiation characteristic or a radiation spectrum that is close to that of the black body.

As described above, a wavelength radiation-emitted from the pattern unit may be an infrared wavelength. Since a band of a wavelength emitted from the heating element is determined by a temperature of the heating element, the temperature of the heating element may range of temperatures at which the near-infrared or middle infrared wavelength band is emitted.

For example, the wavelength that is radiation-emitted from the pattern unit may be an infrared wavelength of about 3 μm or more. Here, the infrared wavelength may range of about 700 nm to several tens of micrometers (μm). A wavelength, which is radiation-emitted from the pattern unit, of the infrared wavelength of several tens of micrometers (μm) may include a middle infrared ray of about 3 μm to about 30 μm. That is, the wavelength radiation-emitted from the pattern unit may be an infrared wavelength except for the solar spectrum and may not overlap the solar spectrum. Here, the solar spectrum may refer to an absorption line (for example, a middle infrared ray) that is absorbed into the atmosphere of the earth and may be a radiation at set level, which reaches the surface of the sea (or the surface of the ground). Here, the solar light reaches the surface of the sea, a portion of the solar light may be absorbed in the atmosphere of the earth, and thus, the solar spectrum may include only near infrared rays having a wavelength of about 70 nm to about 3 μm of the infrared rays.

As described above, a structure having a high emissivity may also have a high absorptivity in the same wavelength. Thus, when a wavelength radiated by a thermal radiation body overlaps the solar spectrum reaching the surface of the sea, the thermal radiation body may absorb the solar light having the overlapping wavelength band to deteriorate heat dissipation performance. Thus, the wavelength that is radiation-emitted from the pattern unit may not overlap the solar spectrum. The solar light has all of the wavelengths of the solar spectrum in an outdoor space, but a portion of the wavelengths of the solar spectrum may be removed while the solar light is incident into an indoor space through a transparent material (layer) such as a window, and the spectrum of the solar light incident into the indoor space may be a portion (or a subset) of the solar spectrum.

When the solar light or the like is incident into the heating element 300, the heating element 300 may increase in temperature (or the heating element is heated) due to heating by the incidence of the light to deteriorate the heat dissipation performance using the thermal radiation body for cooling the heating element. Thus, the thermal radiation body for cooling the heating element may transmit or reflect the solar spectrum at a certain level to prevent the heating element 300 from increasing in temperature by the solar light. Also, the heat generated in the heating element 300 may be effectively released without deteriorating the heat radiation performance by the solar light.

In more detail, (a) of FIG. 3 illustrates a structure in which a planar structure 20 made of a ceramic material is formed on the surface of the heating element 300 to increase in emissivity according to Comparative Example 1. Even when the structure according to Comparative Example 1 is provided on the heating element 300, the small radiation amount as shown in the graph of (c) of FIG. 3 may occur. Since the large radiation amount is not obtained over the wide infrared wavelength band by using only the planar structure 20 formed on the heating element 300, the pattern unit may be additionally formed on the structure according to Comparative Example 1 to increase in radiation amount in the wide wavelength band. As illustrated in (b) of FIG. 3, when the pattern unit is formed (Embodiment 1), intensity of the radiation spectrum may significantly increase over the wide infrared wavelength band due to the optical tunneling phenomenon and the resonant phenomenon.

That is to say, the thermal radiation is determined according to the characteristics of the material (or the optical tunneling effect of the material) and is generated in proportion to an amount of heat absorption absorbed by the object. A material having superior thermal conductivity such as the metal used for the cooling fin 320 according to the related art may rarely achieve the thermal radiation. Thus, when the heat dissipating module is made of only a material having superior thermal conductivity, heat dissipation due to the heat radiation may be rarely achieved. A material that is capable of performing the thermal radiation such as the ceramic material may be formed on the heating element 300 in the form of a plate to perform the heat dissipation due to the thermal radiation through the optical tunneling effect. However, in order to obtain sufficient thermal radiation (amount), the plate-shaped material that is capable of performing the thermal radiation may increase in thickness to increase in volume associated with the amount of thermal absorption. In this case, since heat exchange with the air due to the convection is not performed due to the low thermal conductivity of the material capable of performing the thermal radiation, the heat releasing due to the convection may be blocked due to the thick thickness. Also, when the material is formed at a thick thickness on the cooling fin 320, the heat dissipation performance through the cooling fin 320 may be deteriorated.

However, in the case in which the pattern unit is formed (Embodiment 1), the optical tunneling effect may occur by the thin cover unit 120 made of the material that is capable of performing the thermal radiation to perform the thermal radiation. In addition, the resonant phenomenon may occur by the pore part 110 to increase in amount of light absorption of the pattern unit. Therefore, the thermal radiation amount may increase in proportion to the amount of light absorption. Thus, the cover part 120 made of the material that is capable of performing the thermal radiation may decrease (or be minimized) in thickness (or volume).

Also, (a) of FIG. 4 illustrates a structure in which a thick medium pattern 12, in which the pore part 110 is not formed in the surface of the heating element 300, is formed to increase in emissivity according to Comparative Example 2. When compared to the case (Comparative Example 2) in which the pore part 110 is not formed in the structure with respect to the same structure formed on the heating element 30, the emissivity may be significantly improved in a wavelength band of 8 µm to 10 µm in the case (Embodiment 1) of the pattern unit in which the pore part 110 is formed as illustrated in (c) of FIG. 4.

That is, since the pattern unit is formed on the heating element 300, all heat transferred from the heating element 300 may be released to the outside through the thermal radiation of the pattern unit due to the optical tunneling phenomenon in which light energy is radiated through the thin wall-shaped cover part 120 provided by forming the pore part 11 even though the volume of the medium that is capable of radiating the light energy decreases. Thus, the emissivity at which the heat transferred from the heating element 300 is radiation-released to the outside may increase to more effectively cool the heating element 300.

In the structure (Comparative Example 2) in which the heat transferred from the heating element 300 is transferred through the thick medium pattern 12 in which the pore part 110 is not formed, since the radiation (or absorption) of light occurs in only a portion of the surface of the medium pattern 12 as illustrated in (b) of FIG. 4, a region in which the light is radiated to the outside may be limited. Thus, there is a problem in that heat releasing efficiency of the heating element 300 through the radiation per unit pattern volume is poor because the radiation is not efficiently performed. That is, since the light is radiated to the outside through a portion of the surface of the medium pattern 12 due to the thick medium, and the light is not radiated through a remaining area, the radiation amount per unit pattern volume may be poor.

However, as illustrated in (4) of FIG. 4, when the pattern unit (Embodiment 1) in which the pore part 110 is formed is formed on the heating element 300, the radiation (or the absorption) of the light may be uniformly generated over the entire area of the cover part 120 as illustrated in (d) of FIG. 4 due to the tunneling phenomenon occurring in the cover part 120 having a predetermined thin thickness. That is, since the heat transferred from the heating element 300 is radiation-released to the outside on the entire area of the pattern unit without limiting the area on which the light is radiated, the thermal emissivity may effectively increase when compared to the structure of the medium pattern 12 in which the pore part 110 is not formed even though the medium that is capable of radiating the heat decreases in volume due to the formation of the pore part 110.

Also, reflection of light may occur on all interfaces between materials. As illustrated in (a) of FIG. 4, when an absorption coefficient of one material forming the interface is large due to the large volume of the medium that is capable of radiating the light, the reflection on the interface may increase to decrease in absorptivity. On the other hand, when the volume of the medium capable of radiating the light decreases, since an effect of reducing an effective absorption coefficient of the material is generated in view of the light, the reflection on the interface may be reduced to improve the absorptivity.

Thus, when the pattern unit constituted by the thin wall-shaped cover part 120 and the pore part 110 is formed, the tunneling phenomenon of the light due to the cover part 120 may occur to reduce the reflection rate, and thus, the intensity of the radiation may be significantly improved.

Also, the radiation amount may increase not only by the light tunneling phenomenon but also by the resonant phenomenon of the light generated in the pattern unit. The resonant phenomenon is a phenomenon in which a wave of a specific frequency satisfying a standing wave is amplified in a closed tube. When the pattern unit serving as the closed tube is provided on the surface of the heating element 300, the resonant phenomenon may occur in the pattern unit (i.e., the pore part) for each specific wavelength that satisfies the standing wave condition.

The resonance of the light occurs to match a height of the pattern unit protruding perpendicular to the heating element 300. The resonance may occur when a natural number multiple (or n times) of half of a sine waveform of one cycle (or a length of half-wavelength having a phase difference of about 180°) is equal to the height of the pattern unit. That is, the resonance occurring in the pattern unit may occur by the natural number multiple of the half-wavelength in which the light vertically vibrates according to the height of the pattern unit that is perpendicular to the heating element 300.

When the resonant phenomenon of the light occurs, the light incident into the pattern unit (the pore part) may stay for a long time inside the pattern unit without being emitted to the outside of the pattern unit (or the cover part) for a short time so as to be contributed to the increase of the light radiation.

Here, the height of the pattern unit, at which the resonance effectively occurs (or the height of the cover part protruding perpendicular to the heating element) for effectively generating resonance may be greater than at least $\lambda/2n$ (where $\lambda$ is a peak wavelength of light radiated from the pattern unit, and n is a refractive index of the cover part at the peak wavelength) in consideration of the resonant effect and may be set to a height less than a length that is capable of being physically formed from $\lambda/2n$.

As described above, when the pattern unit is provided on the heating element 300, the emissivity may increase over the wide infrared wavelength band through the resonant effect and the optical tunneling effect of the light. Also, although most of the volume is filled with air or a gas that is not capable of radiating light, the emissivity may be obtained higher than that of the structure that is filled with the dielectric.

Figure 5:
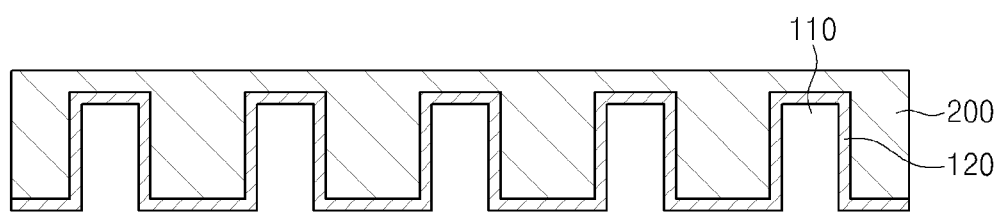
FIG. 5 is a cross-sectional view illustrating a thermal radiation body for cooling a heating element, which includes a base layer in accordance with an exemplary embodiment.
Figure 5:
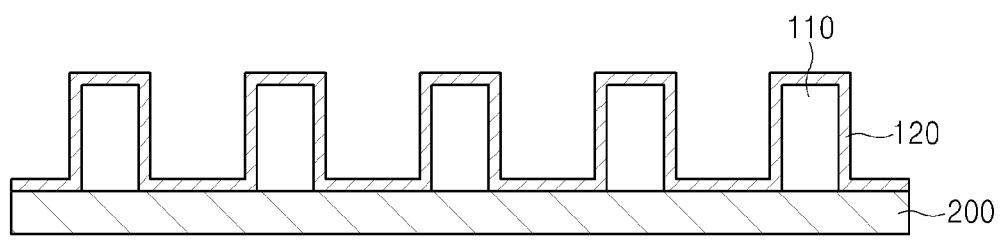

FIG. 5 is a cross-sectional view of the thermal radiation body for cooling the heating element, which includes the base layer, according to an embodiment of the present inventive concept. Here, (b) of FIG. 5 illustrates the base layer provided on the pattern unit, and (b) of FIG. 5 illustrates the base layer supporting the pattern unit provided on a surface thereof.

Referring to FIG. 5, the pattern unit may be provided in the form of a plurality of unit patterns that are spaced apart from each other. As a spatial density of the pattern unit formed on the heating element 300 increases, the total light radiation efficiency may increase due to an overlapping effect of the single pattern unit. Thus, the thermal radiation body for cooling the heating element according to the present inventive concept may be constituted by a plurality of pattern units spaced apart from each other (in a plurality of unit patterns spaced apart from each other) on the heating element 300, but not provided as a single pattern unit. Since the pattern unit that is not provided as the single pattern unit but provided as the plurality of unit patterns spaced apart from each other is disposed on the heating element 300, the light generated from the heating element 300 may be entirely uniformly radiated through the overlapping effect of the pattern unit to improve the radiation cooling efficiency.

Here, since the cover part 120 is provided on the plurality of pore parts 110 in the plurality of pattern units, one cover part may be continuously formed, or the cover parts may be separated from each other to be respectively provided on edges of the pore parts 110.

The thermal radiation body for cooling the heating element according to the present inventive concept may further include a base layer 200 provided on the pattern unit to support or protect the pattern unit.

The base layer 200 may be provided on the pattern unit to support and protect the pattern unit. Thus, the base layer 200 may serve to support the cover part 120 and may be transferred from a substrate 100 forming the pattern unit to support the pattern unit.

As illustrated in (a) of FIG. 5, the base layer 200 may be provided on an upper portion of the pattern unit to prevent the thin pattern unit (i.e., the cover part) from being torn or damaged by an external factor while supporting the pattern unit. For example, the base layer 200 may cover the pattern unit to serve as a protection layer and prevent the unit patterns of the pattern units from separately moving (or flowing). Thus, the base layer 200 may prevent the unit patterns form being separated from each other or prevent the cover part 120 from being torn due to force acting in a direction away from each other. The base layer 200 provided on the upper portion of the pattern unit may replace the role of a transfer film 220. However, unlike the transfer film 220, the base layer 200 may not be removed after the thermal radiation body for cooling the heating element is formed on the heating element 300.

Also, as illustrated in (b) of FIG. 5, the base layer 200 may be provided on a lower portion of the pattern unit to support the pattern unit provided on a surface thereof. Here, the base layer 200 may have a thin thickness to manufacture a thermal radiation body for cooling a flexible heating element. Also, when a surface on which the pattern unit is provided is flattened to be directly transferred onto the cooling fin 320 or the heating element 300 of an uneven pattern, the base layer 200 may effectively absorb and receive heat generated from the cooling fin 320. Also, the base layer 200 may provide a support surface (or a flat surface) on which an adhesion layer (not shown) is supported and may be a buffer layer performing a buffer function between the pattern unit (i.e., the cover part) and the heating element 300.

Here, the thermal radiation body for cooling the heating element, which includes the base layer 200, may be provided in the form of a sheet. Alternatively, when the thermal radiation body for cooling the heating element is flexible, the thermal radiation body may be provided in the form of a roll. Thus, the thermal radiation body for cooling the heating element, which is provided in the form of the roll, may be cut into a desired size (or length) and then attached to a desired portion (or position).

Figure 6:
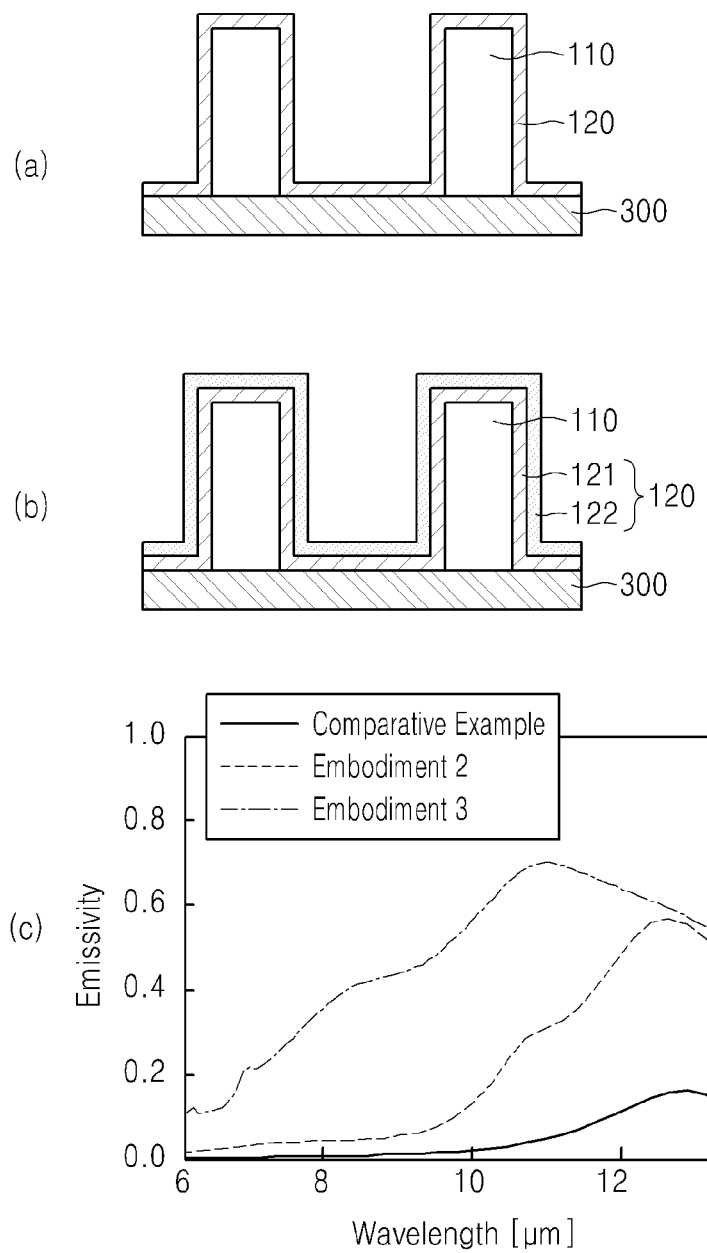
FIG. 6 is a cross-sectional view illustrating a thermal radiation body for cooling a heating element, which includes a reflection layer or an anti-reflection layer in accordance with an exemplary embodiment.

FIG. 6 is a cross-sectional view of a first cover part and a second cover part according to an embodiment of the present inventive concept. Here, (a) of FIG. 6 illustrates a structure in which the cover part includes only a first cover part according to Embodiment 2, (b) of FIG. 6 illustrates a structure in which the cover part includes a first cover part and a second cover part according to Embodiment 3, and (c) of FIG. 6 illustrates a graph of emissivities according to Comparative Example, Embodiment 2, and Embodiment 3.

Referring to FIG. 6, the cover part 120 may include: a first cover part 121 contacting the pore part 110; and a second cover part 122 provided on the first cover part 121 and made of a material different from that of the first cover part 121.

The cover part 120 may be provided in a plurality of layers in which different materials are laminated. In more detail, the cover part 120 may include the first cover part 121 covering the pore part 110 to define an area of the pore part 110 and the second cover part 122 formed on the first cover part 121 and made of a ceramic material different from the material of the first cover part 121. Here, the ceramic materials forming the cover part 120 may be ceramic materials having different light absorptivities in a predetermined wavelength band.

The first cover part 121 may contact the pore part 110 and cover the pore part 110 to define an area of the pore part 110. Here, the first cover part 121 may be made of the ceramic material or may be made of an oxide- or nitride-based dielectric having superior middle-infrared ray absorption ability.

The second cover part 122 may be provided on the first cover part 121 and made of a material different from that of the first cover part 121. Here, the second cover part 122 may be made of a single material different from that of the first cover part 121 and also be a composite made of a plurality of materials different from that of the first cover part 121. Alternatively, the second cover part 122 may be provided to have a multi-layered structure in which a plurality of material layers made of a plurality of materials different from that of the first cover part 121 are laminated. Here, the second cover part 122 may also be made of the ceramic material or may be made of an oxide- or nitride-based dielectric having superior middle infrared ray absorption ability.

The cover part 120 may additionally include an n-th cover part such as a third cover part (not shown), a fourth cover part (not shown), and the like in addition to the first cover part 121 and the second cover part 122. Here, the third cover part (not shown) may be made of a material different from that of the second cover part 122, may be made of a material different from that of the first cover part 121, or made of the same material as each of the second cover part 122 and the first cover part 121. Also, the fourth cover part (not shown) may be made of a material different from that of the third cover part (not shown), may be made of a material different from that of the first cover part 121 and/or the second cover part 122, or made of the same material as the second cover part 122 and/or the first cover part 121. That is, the n-th cover part may be made of a material different from that of each of the cover parts that are vertically adjacent thereto.

Also, the first cover part 121 and the second cover part 122 may be made of ceramic materials having different light absorptivities in a predetermined wavelength band. In general, the ceramic material is excellent in capability of absorbing the medium infrared rays and thus is high in heat emissivity in the same band. The oxide- or nitride-based dielectric of the ceramic materials has a very excellent ability in absorbing the middle infrared rays and thus is very high in heat emissivity in the same band. Also, as a volume of the ceramic material increases, an absorption amount may increase, and an amount of thermal radiation may increase in proportion to the absorption amount. Thus, as a thickness of the ceramic material increases, the amount of thermal radiation may increase. However, it is disadvantageous in that the plate-shaped ceramic material has to be formed at a thick thickness of several tens to several hundreds of micrometers or more in order to have sufficient heat radiation amount.

Also, since the ceramic material is not heat-exchanged with air through convection due to low thermal conductivity, when the ceramic material is formed at the thick thickness, the heat radiation due to the convection may be prevented to deteriorate the heat radiation performance. When the pore part 110 is formed to cause the resonant phenomenon, an effect of increasing a time and the number of times at which light passes through the pattern portion may be obtained. Thus, the emissivity that is capable of being obtained from the thick material even in the thin ceramic material may be obtained. Also, the cover part 120 made of the ceramic material may have a thick thickness.

The radiation amount in the wide wavelength band may increase according to a temperature of the heating element 300 that varies within a temperature range in which the infrared wavelength band is emitted. Since the ceramic material has a wavelength band in which the emissivity (or absorptivity) is maximized within the middle infrared wavelength band that is inherent to the ceramic material, when the cover part 120 is formed using various ceramic materials, a radiation amount may increase in the wide infrared wavelength band due to the overlapping of the wavelength bands in which the emissivity is maximized.

In more detail, (c) of FIG. 6 illustrates an emissivity when the pattern unit on which the single cover part 120 is formed is formed on the heating element 300 as illustrated in (a) of FIG. 6 according to Embodiment 2, an emissivity when the pattern unit on which the multi-layered cover part 120 (i.e., the first cover part and the second cover part) are formed is formed on the heating element 300 as illustrated in (b) of FIG. 6 according to Embodiment 3, and an emissivity of the heating element 300 on which the pattern unit is not formed according to Comparative Example (not shown).

Referring to FIG. 6, according to Comparative Example, the emissivity is significantly lower than those according to Embodiments of FIG. 6, in which the single or multi-layered pattern is formed. According to Embodiment 3, it may be confirmed that the emissivity generally increases in the wide infrared wavelength band when compared that according to Embodiment 2. Thus, when the cover part 120 is formed in multiple layers by using various ceramic materials having different wavelength bands in which the radiation ratio is maximized, it is possible to have an improved radiation spectrum in the wide infrared wavelength range due to the overlapping of the wavelength bands having a maximum point of the emissivity.

Various ceramic materials including oxide- or nitride-based dielectrics such as $SiO_2$, $TiO_2$, $Al_2O_3$, $Si_3N_4$, $HfO_2$, and the like forming the cover part 120 have a wavelength band in which the absorption (or the radiation) is maximized in a predetermined wavelength band, when the cover part 120 is formed by laminating two or more ceramic materials having different wavelength bands in which the maximum point of the emissivity exists, it is possible to maximize the radiation intensity in the desired wavelength band or the wide infrared wavelength band. That is to say, since each of the ceramic materials has a slightly different wavelength band in which the absorptivity is maximized, when the cover part 120 is formed by combining the ceramic materials having the different absorption bands in at least two or more than one cover part 120 using only one ceramic material, radiation efficiency may increase in the wider wavelength band due to the overlapping of the wavelength bands in which the emissivity is maximized.

Figure 7:
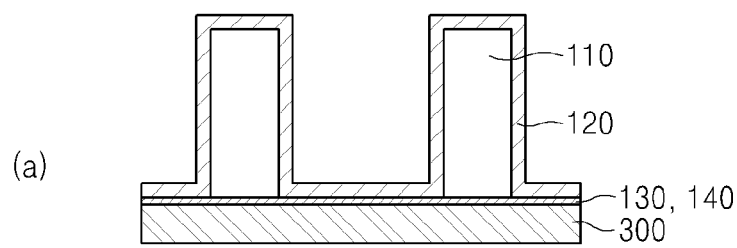
FIG. 7 is a cross-sectional view of a thermal radiation body for cooling a heating element, which includes a reflection layer or an anti-reflection layer in accordance with an exemplary embodiment.
Figure 7:
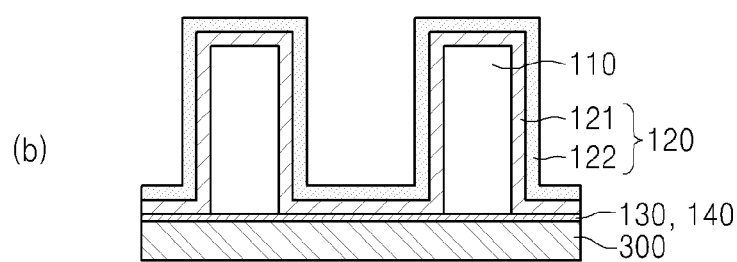
Figure 7:
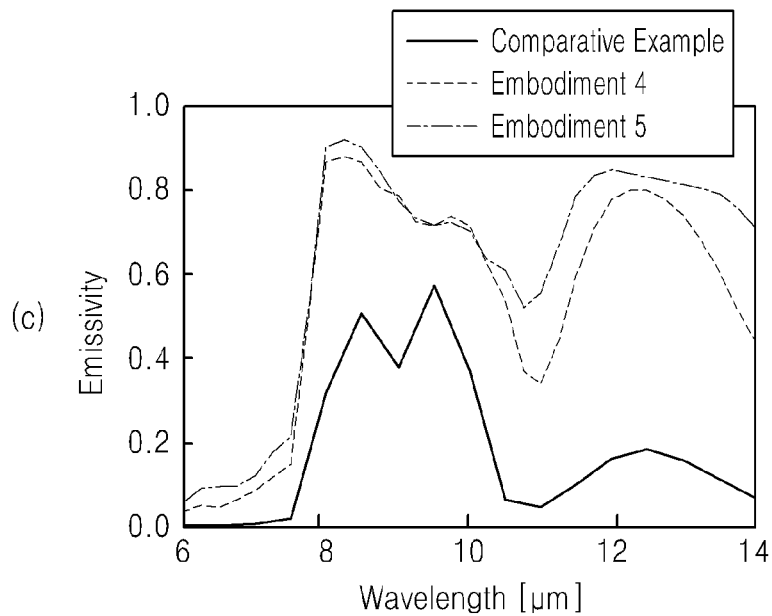

FIG. 7 is a cross-sectional view of the thermal radiation body for cooling the heating element, which includes a reflection layer or an anti-reflection layer, according to an embodiment of the present inventive concept. Here, (a) of FIG. 7 illustrates a structure in which the cover part including only the first cover part and the reflection layer or the anti-reflection layer are provided according to Embodiment 4, (b) of FIG. 7 illustrates a structure in which the cover part including the first cover part and the second cover part and the reflection layer or the anti-reflection layer are provided according to Embodiment 5, and (c) of FIG. 7 illustrates a graph of emissivities according to Comparative Example, Embodiment 4, and Embodiment 5.

Referring to FIG. 7, the thermal radiation body for cooling the heating element according to the present inventive concept may further include a reflection layer 140 provided between the surface of the heating element 300 and the pattern unit, to reflect light incident into the surface of the heating element 300 from the outside. The reflection layer 140 may be provided between the surface of the heating element 300 and the pattern unit to reflect the light incident into the surface of the heating element 300 again from the outside. When the light is incident into the heating element 300 (i.e., the inside of the heating element) through the surface of the heating element 300 from the outside, the heating element 300 may be heated by the incident light to increase in temperature, thereby deteriorating the heat dissipation performance of the thermal radiation body for cooling the heating element. Thus, the reflection layer 140 may be provided between the surface of the heating element 300 and the pattern unit to reflect the light incident into the surface of the heating element 300 to the outside. Therefore, heat may be generated in the heating element 300 by only the heat generation of the heating element 300 itself, and the heat generated in the heating element 300 may be effectively released without deteriorating the heat dissipation performance due to external thermal factors.

Here, the reflection layer 140 may reflect the light and have thermal conductivity. The reflection layer 140 may have a main purpose of reflecting the light incident into the surface of the heating element 300. However, since the heating element 300 is disposed between the heating element 300 and the pattern unit to well transfer the heat of the heating element 300 to the pattern unit, the reflection layer 140 may have thermal conductivity. That is, since the thermal radiation body for cooling the heating element receives the heat from the heating element 300 through the conduction to release the heat to the outside through the thermal radiation in the pattern unit, the heat conduction from the heating element 300 to the pattern unit is important. Also, since the reflective layer 140 is disposed between the heating element 300 and the pattern unit, the heat generated (or transferred) from the heating element 300 through the thermal conduction may be effectively transferred to the pattern unit.

For example, the reflection layer 140 may be provided as a metal layer or may be a multi-inorganic layer or a composite layer of a metal and an inorganic material. When the reflection layer 140 is provided as the metal layer, the reflection layer 140 may basically have high optical reflectivity as well as the thermal conductivity.

Also, the reflection layer 140 may be the multi-inorganic layer or a distributed Bragg reflection (DBR) layer in which a plurality of inorganic layers having different refractive indexes are alternately laminated. For example, the DBR layer may be formed using an oxide layer or a nitride layer. Also, a high refractive index layer and a low refractive index layer may be repeatedly laminated alternately several times, and an optical thickness of these layers may be adjusted so that reflectance for light having a specific wavelength is maximized to 90% or more. For example, a thickness of the multi-inorganic layer may be λ2/4n2 (where λ2 is a peak wavelength of the light incident into the pattern unit from the outside, and n2 is a refractive index of each inorganic layer at the peak wavelength). Here, since the multi-inorganic layer has relatively low thermal conductivity (or is lower than that of the metal layer), the number of times of lamination of the high refractive index layer and the low refractive index layer may be reduced, and the thickness of the entire reflective layer may be reduced.

The reflection layer 140 may be a composite layer of a metal and an inorganic material. When the inorganic layer is further thinly laminated on the metal layer, the reflectance may more increase by using the total reflection phenomenon of the inorganic layer, and the heat conductivity may be hardly affected. Also, the reflection layer 140 may be made of a material that is capable of effectively transferring the heat generated in the heating element 300 to the pattern unit. Here, the reflection layer 140 may be used for the heating element 300 that is not an optical element such as a light emitting element (LED), a solar cell, or an optical sensor, that is, an electronic element (i.e., a non-optical element without entrance of the light).

The thermal radiation body for cooling the heating element according to the present inventive concept may further include an anti-reflection layer 130 provided between the surface of the heating element 300 and the pattern unit, to prevent reflection of the light incident into the surface of the heating element 300 from inside the heating element 300 or the outside.

The anti-reflection layer 130 may be provided between the surface of the heating element 300 and the pattern unit, to prevent or suppress the reflection of the light incident into the surface of the heating element 300 from the inside the heating element 300 or the outside, and may be a transmission layer through which the light is transmitted. When the heating element 300 is the optical element such as the light emitting element (LED), the solar cell, or the optical sensor in which light enters (that is, is incident and emitted), since the thermal radiation body for cooling the heating element does not have to interfere with the progress of the light, the light incident into the surface of the heating element 300 from the inside the heating element 300 or the outside may be prevented or suppressed so that an amount of light is not reduced by the surface reflection occurring by the thermal radiation body for cooling the heating element. Here, the anti-reflection layer 130 may be made of a material having superior thermal conductivity.

The pattern unit may function as a light extraction structure (or a light incidence structure) when the heating element 300 is the optical element to effectively extract the light emitted from the inside of the heating element 300 to the outside and may allow the light incident into the surface of the heating element 300 from the outside to be effectively incident into the surface (or the inside) of the heating element 300.

(c) of FIG. 7 illustrates an emissivity when the pattern unit, on which the single cover part 120 is formed, and the reflection layer 140 or the anti-reflection layer 130 are formed on the heating element 300 as illustrated in (a) of FIG. 7 according to Embodiment 4, an emissivity when the pattern unit, on which the multi-layered cover part 120 is formed, and the reflection layer 140 or the anti-reflection layer 130 are formed on the heating element 300 as illustrated in (b) of FIG. 7 according to Embodiment 5, and a reflection rate when only the planar structure 20 is formed on the surface of the heating element 300 without providing the pattern unit according to Comparative Example (not shown).

Referring to (c) of FIG. 7, according to Embodiments 4 and 5, the emissivity is greater than that according to Comparative Example. The multi-layered cover part 120 according to Embodiment 5 has an emissivity greater than that of the single cover part 120 according to Embodiment 4.

The thermal radiation body for cooling the heating element may further include an adhesion layer (not shown) attached to the heating element 300.

The adhesion layer (not shown) may be attached on the surface of the heating element 300 or the heat dissipation structure formed on the heating element 300. Also, the thermal radiation body for cooling the heating element may be attached to the surface of the heating element 300 in the form of a tape through the adhesion layer (not shown). For example, the thermal radiation body for cooling the heating element may be formed into a tape-like sheet including the adhesion layer (not shown) or may be flexibly manufactured to provide the thermal radiation body for cooling the heating element in the form of a roll. Here, the adhesion layer (not shown) may include an adhesion material, or a flowable adhesion material having an adhesive property be processed to be formed in the form of a bar. For example, the adhesion material may include a polymer-based adhesion material, but not limited thereto, and various materials other than the polymer-based adhesion material may be used as the adhesion material forming the adhesion layer (not shown).

Also, the pore part 110 may be formed by removing a sacrificial layer pattern 210 covered with the cover part 120 through heat treatment or wet etching. For example, the cover part 120 is deposited on the sacrificial layer pattern 210 after the sacrificial layer pattern 210 may be formed on the substrate 100, and the sacrificial layer pattern 210 provided between the substrate 100 and the cover part 120 may be removed to form the pore part 110. Here, the substrate 100 may form the pattern unit and support the formed pattern unit to provide the pattern unit on the heating element 300. The pore part 110 may be provided between the substrate 100 and the cover part 120, and the cover part 120 may be supported to be provided on the substrate. Here, the sacrificial layer pattern 210 may be removed through the heat treatment or the wet etching.

Also, a thickness of the cover part 120 may be 50 nm to λ/n (where λ is a peak wavelength of the light radiated from the pattern unit, and n is a refractive index of the cover part at the peak wavelength). Here, the peak wavelength may be a wavelength in which the emissivity of a thermal radiation source (i.e., the pattern unit) is maximized.

Although a method for forming the pore part 110 will be described in detail with reference to a method for manufacturing the thermal radiation body for cooling the heating element, a method for forming the sacrificial layer pattern 210 to be described later on the surface of the substrate 100 and a method for removing the sacrificial layer pattern 210 after the cover part 120 (e.g., the first cover part) is formed may be provided. The sacrificial layer pattern 210 may be removed through thermal oxidation (or pyrolysis) or wet etching.

When a thickness of the cover part 120 is thinner than 50 nm, mechanical strength of the cover part 120 is lowered. Thus, it may be difficult to stably maintain the cover part 120 without collapse, and the cover part 120 may be easily damaged. On the other hand, when the thickness of the cover part 120 is thicker than λ/n, the light tunneling effect may be reduced, and the surface reflectance may increase to deteriorate the thermal radiation efficiency.

Hereinafter, an electronic device according to another embodiment of the present inventive concept will be described in more detail. In the description of a thermal radiation body for cooling a heating element according to this embodiment, duplicated descriptions with respect to the above-described thermal radiation body for cooling the heating element will be omitted.

An electronic device according to another embodiment of the present inventive concept includes: a heating element 300 as an electronic element; and a thermal radiation body for cooling the heating element according to an embodiment of the present inventive concept, which is provided on the heating element 300.

The heating element 300 may be the electronic element, and the thermal radiation body for cooling the heating element may be mounted on the heating element 300. Here, the electronic element may include a solar cell module (or device), a light emitting element, and an electronic component. Since a large amount of heat is generated from the solar cell module, the light emitting element, and the electronic component is generated. The thermal radiation body for cooling the heating element may be provided (attached to) on the surface of the heating element 300 to simply provide the thermal radiation body for cooling the heating element, which dissipates the heat of the heating element 300 and effectively release the heat generated in the heating element 300 to the outside through the thermal radiation body for cooling the heating element.

The thermal radiation body for cooling the heating element may release the heat transferred from the heating element through conduction to the outside through thermal radiation. Here, the thermal radiation body for cooling the heating element may be provided in the form of sheet having a tape shape and may be simply attached to the surface of the heating element 300.

The thermal radiation body for cooling the heating element may be directly formed on the heating element 300 or may be attached to be fixed to the heating element 300. For example, the pattern unit may be formed by depositing a sacrificial layer pattern 210 and a cover part 120 on the heating element 300, or the thermal radiation body for cooling the heating element, on which the pattern unit is previously formed, may be formed into the tape shape so as to be attached and fixed to the heating element 300. Here, the thermal radiation body for cooling the heating element may be manufactured in the form of the sheet form or may be manufactured to be flexible and thus provided in the form of a roll. Thus, a configuration for radiating the heat of the heating element 300 by merely attaching the thermal radiation body for cooling the heating element 300 on the heating element 300 may be simply added to effectively improve the heat radiation effect.

The electronic element may include a light receiving element, and the cover part 120 may be transmissive with respect to a wavelength band of light absorbed by the light receiving element. The heating element 300 may be a light receiving element that absorbs light from the outside. The cover part 120 may be transmissive with respect to a wavelength band of light absorbed by the light receiving element so as to allow the light to be incident through the cover part 120 from the outside. When the cover part 120 is not transmissive with respect to a wavelength band of light emitted from the light receiving element, the light may not be incident the cover part 120. Thus, the light receiving element may not absorb the light in a direction of the cover part 120 and thus may not perform its function. Thus, the cover part 120 may be transmissive with respect to the wavelength band of the light absorbed by the light receiving element so as to perform the function of the light receiving element.

For example, when the cover part 120 is the solar cell module of the light receiving element, the cover part 120 may be transmissive with respect to at least a portion of the wavelength region of solar light or may have an average absorptivity of 20% or less with respect to the solar light. The cover part 120 may have an average absorptivity of 20% or less with respect to the solar light (or in a solar spectrum band) and also may slightly absorb the solar light or may not absorb the solar light. That is, the cover part 120 may be configured so as not to absorb the solar spectrum. For example, when the cover part 120 is made of TiO2, the average absorptivity with respect to solar light may be 20% or less. When the cover part 120 is made of SiO2, the average absorptivity with respect to the solar light may be lowered to 10% or less. When the cover part 120 absorbs the solar light, the heat generated by the cover part 120 absorbing the solar light may increase a temperature of the cover part 120 and/or the heating element 300. Thus, the heat dissipation performance using the thermal radiation body for cooling the heating element may be deteriorated. Also, when the heating element 300 is the solar cell module, the cover part 120 absorbs the solar light first before the solar light reaches the solar cell module (i.e., the heating element), and thus, the absorption amount (or absorptivity) of the solar cell module may be lower (reduced). Thus, the cover part 120 may not absorb the solar light or may slightly absorb the solar light.

Also, the cover part 120 may be transmissive (or transparent) to at least a portion of the wavelength region of the solar light. When the cover part 120 does not transmit (or pass through) the solar light, if the heating element 300 is the solar cell module, the solar light may not reach the solar cell module (i.e., the heating element), and thus, the solar cell module may not absorb the solar light (and/or solar heat) and may not convert solar energy into electric energy. Thus, the cover part 120 may be transmissive with respect to at least a portion of the wavelength region of the solar light.

Also, the electronic element may include a light emitting element, and the cover part 120 may be transmissive with respect to a wavelength band of light emitted from the light emitting element. The heating element 300 may be the light emitting element that emits light to the outside. The cover part 120 may be transmissive with respect to the wavelength band of the light emitted from the light emitting element so as to allow the light to be emitted through the cover part 120 (in the direction of the cover part). When the cover part 120 is not transmissive with respect to the wavelength band of the light emitted from the light emitting element, since the light is not emitted toward the cover part 120, the cover part 120 may be transmissive with respect to the wavelength band of the light emitted from the light emitting element when the light is emitted in the direction of the cover part 120.

Also, the heating element 300 may include a support substrate on which a laminate structure (or a forming material) is supported, and the pattern unit may be provided on the support substrate. For example, the thermal radiation body for cooling the heating element may be attached to the support substrate of the heating element 300 so that the pattern unit is provided on the support substrate. Here, the support substrate may be made of a semiconductor material.

Figure 8:
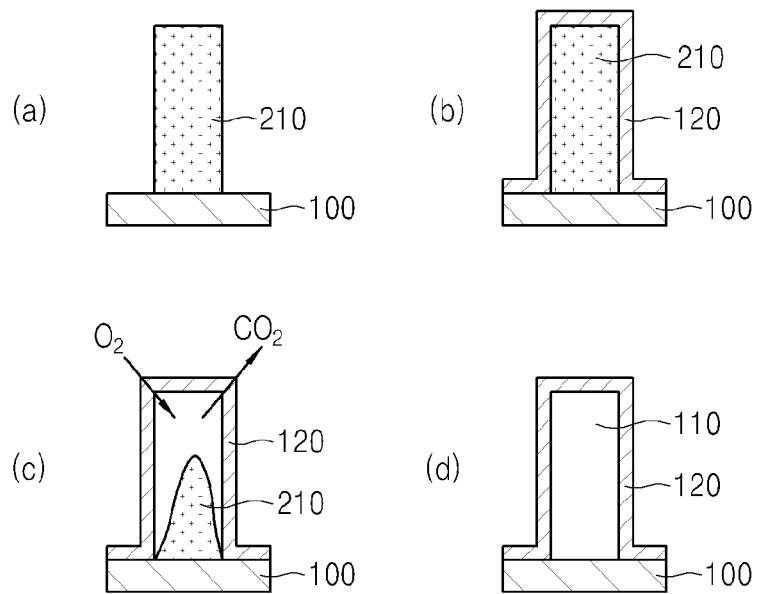
FIG. 8 is a cross-sectional view sequentially illustrating a method for manufacturing a thermal radiation body for cooling a heating element in accordance with another exemplary embodiment.

FIG. 8 is a cross-sectional view sequentially illustrating a method for manufacturing a thermal radiation body for cooling a heating element according to another embodiment of the present inventive concept. Here, (a) of FIG. 8 illustrates a process of forming a sacrificial layer, (b) of FIG. 8 illustrates a process of forming a cover part, (c) of FIG. 8 illustrates heat treatment under an oxygen atmosphere, and (d) of FIG. 8 illustrates a state in which the sacrificial layer is removed.

Hereinafter, a method for manufacturing a thermal radiation body for cooling a heating element according to further another embodiment of the present inventive concept will be described in more detail with reference to FIG. 8. In descriptions of a thermal radiation body for cooling a heating element according to an embodiment of the present inventive concept and an electronic device according to another embodiment of the present inventive concept, duplicated descriptions with respect to the above-described electronic device will be omitted.

A method for manufacturing a thermal radiation body for cooling a heating element according to further another embodiment of the present inventive concept includes: a process (S100) of forming a sacrificial layer pattern 210 on a substrate 100; a process (S200) of forming a cover part 120 on the sacrificial layer pattern 210; and a process (S300) of removing the sacrificial layer pattern 210 by performing heat treatment under the oxygen atmosphere.

First, as illustrated in (a) of FIG. 8, the sacrificial layer pattern 210 is formed on the substrate 100 (S100). For example, the sacrificial layer pattern 210 may be formed by a photolithography process. A photosensitive layer PR may be applied on the substrate 100 through a method such as spin coating and then exposed by using a photo mask having a pattern to develop and remove the exposed portion, thereby forming the sacrificial layer pattern 210.

Next, the cover part 120 is formed on the sacrificial layer pattern 210 (S200). After the sacrificial layer pattern 210 is formed, as illustrated in (b) of FIG. 8, the cover part 120 defining an area of a pore part 110 may be formed (or deposited) on the sacrificial layer pattern 210. Here, the cover part 120 may be formed in various methods such as chemical vapor deposition (CVD), physical vapor deposition (PVD), atomic layer deposition (ALD), and the like. When the cover part 120 is formed, at least a portion of the cover part 120 may contact the substrate 100 to provide a frame into which the pore part 110 is accommodated.

Next, the sacrificial layer pattern 210 is removed (S300). After the cover part 120 is formed, as illustrated in (c) of FIG. 8, the sacrificial layer pattern 210 may be removed from the substrate 100. After the sacrificial layer pattern 210 is removed, as illustrated in (d) of FIG. 8, a pattern unit structure in which the pore part 110 is formed in the position from which the sacrificial layer pattern 210 is removed may be obtained.

In the process (S300) of removing the sacrificial layer pattern 210, the sacrificial layer pattern 210 may be removed through heat treatment under the oxygen atmosphere or wet etching. The sacrificial layer pattern 210 may be easily removed by thermal oxidation under the oxygen atmosphere because the sacrificial layer pattern 210 is an organic material (polymer) having a natural ignition point near to about 600° C. Here, after only a first cover part 121 of the cover part 120 is formed, the sacrificial layer pattern 210 may be removed. That is, when the sacrificial layer pattern 210 is heated at a high temperature under the oxygen atmosphere in the first cover part 121, a polymer component may be easily removed through chemical reaction with a gas containing oxygen through the thermal oxidation (or pyrolysis) process. Also, oxygen gases react with carbon, which is a main component of the polymer, and pass through the first cover part 121 in a compound gas state of $CO_2$, spread out into a chamber, and discharged by a vacuum pump.

Also, the sacrificial layer pattern 210 may be removed through the wet etching. The sacrificial layer pattern 210 may be etched and removed through the wet etching process. The sacrificial layer pattern 210 may be made of an organic material and may be etched by an organic solvent (or a solvent). The organic solvent may not affect other components such as the heating element 300 and the cover part 120. Thus, the sacrificial layer pattern 210 may be easily removed while maintaining the shape of the cover part 120 forming the pore part 110.

Figure 9:
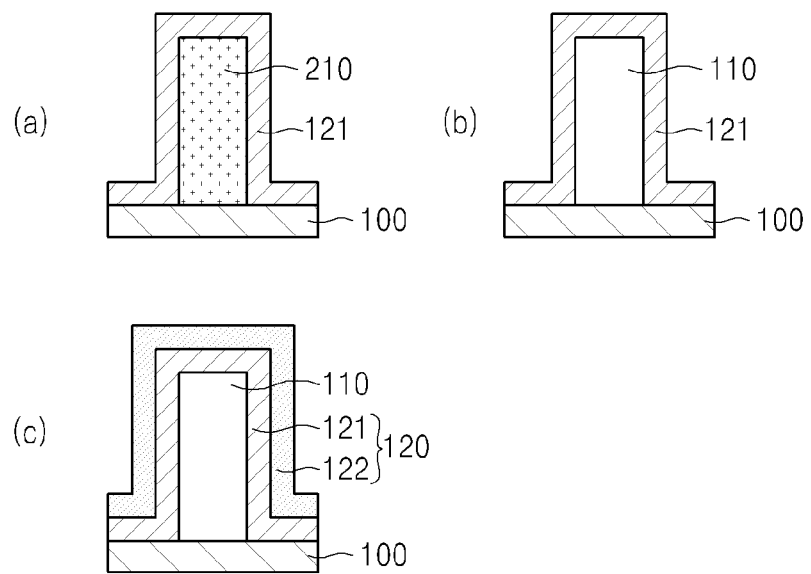
FIG. 9 is a cross-sectional view illustrating a process of manufacturing a first cover part and a second cover part in accordance with another exemplary embodiment.

FIG. 9 is a cross-sectional view illustrating a process of manufacturing a first cover part and a second cover part according to another embodiment of the present inventive concept. Here, (a) of FIG. 9 illustrates a process of forming a sacrificial layer and a first cover part, (b) of FIG. 9 illustrates a process of removing the sacrificial layer, and (c) of FIG. 9 illustrates a process of forming a second cover part.

Referring to FIG. 9, the process (S200) of forming the cover part 120 may include: a process (S210) of depositing a first cover part 121 on a sacrificial layer pattern 210; and a process (S220) of depositing a second cover part 122 on the first cover part 121 by using a ceramic material different from that of the first cover part 121. Here, the process (S220) of depositing the second cover part 122 may be performed after the process (S300) of removing the sacrificial layer pattern 210.

As illustrated in (a) of FIG. 9, the first cover part 121 may be deposited on the sacrificial layer pattern 210 (S200). The first cover part 121 may be deposited in various methods such as chemical (CVD), physical (PVD), atomic layer deposition (ALD), and the 1 like. When the first cover part 121 is deposited, at least a portion of the first cover part 121 may contact a substrate 100 to provide a frame into which a pore part 110 is accommodated. Here, the first cover part 121 having a predetermined thin thickness may be deposited on the sacrificial layer pattern 210 so that a compound such as oxygen ad $CO_2$ is transmitted to the inside and the outside through the first cover part 121 to remove the sacrificial layer pattern 210.

Also, a second cover part 122 may be deposited on the first cover part 121 by using a ceramic material different from that of the first cover part 121. Here, the second cover part 122 may be deposited the first cover part 121 after a compound such as oxygen ad $CO_2$ is transmitted to the inside and the outside through the first cover part 121 to remove the sacrificial layer pattern 210. When the sacrificial layer pattern 210 is removed, as illustrated in (b) of FIG. 9, the first cover part 121 is prevented from being collapsed, and the structure may be stably maintained to form the pore part 110. Also, as illustrated in (c) of FIG. 9, the second cover part 122 may be stably formed on the first cover part 121.

Here, the second cover part 122 may be made of a ceramic material, or a ceramic material having an absorptivity different from that of the first cover part 121 in a predetermined wavelength band may be deposited on the second cover part 122. As illustrated in (c) of FIG. 8, after the first cover part 121 covering the pore part 110 to define an area of the pore part 110 is formed, the second cover part 122 made of a ceramic material having an absorptivity different from that of the first cover part 121 in a predetermined wavelength band may be formed on the first cover part 121. Here, the ceramic materials forming the cover part 120 may be ceramic material having light absorptivities different from each other in a predetermined wavelength band. The second cover part 122 may be formed by various methods such as chemical vapor deposition (CVD), physical vapor deposition (PVD), and atomic layer deposition (ALD), like the first cover part 121.

Figure 10:
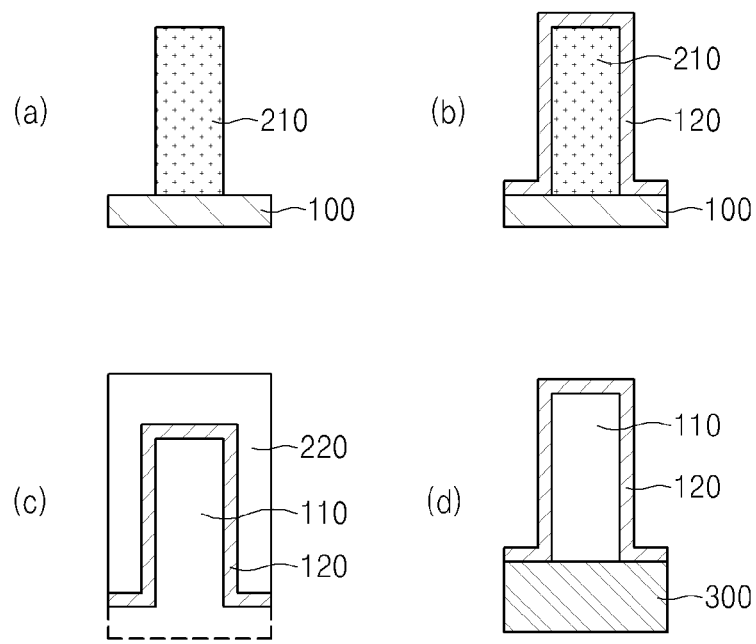
FIG. 10 is a cross-sectional view sequentially illustrating a method for manufacturing a thermal radiation body for cooling a heating element in accordance with another exemplary embodiment.

FIG. 10 is a cross-sectional view sequentially illustrating a method for manufacturing a thermal radiation body for cooling a heating element according to another embodiment of the present inventive concept. Here, (a) of FIG. 10 illustrates a process of forming a sacrificial layer, (b) of FIG. 10 illustrates a process of forming a cover part, (c) of FIG. 10 illustrates a process of forming a transfer film and removing a substrate and a sacrificial layer pattern, and (d) of FIG. 10 illustrates a process of attaching a pattern unit on the heating element.

Hereinafter, a method for manufacturing a thermal radiation body for cooling a heating element according to further another embodiment of the present inventive concept will be described in more detail with reference to FIG. 10. In descriptions of a thermal radiation body for cooling a heating element according to an embodiment of the present inventive concept, an electronic device according to another embodiment of the present inventive concept, and a method for manufacturing a thermal radiation body for cooling a heating element according to further another embodiment, duplicated descriptions with respect to the above-described electronic device will be omitted.

A method for manufacturing a thermal radiation body for cooling a heating element according to further another embodiment of the present inventive concept includes: a process (S100) of forming a sacrificial layer pattern 210 on a substrate 100; a process (S200) of forming a cover part 120 on the sacrificial layer pattern 210; a process (S250) for forming a transfer film 220 on the cover part 120; and a process (S350) of removing the substrate 100 and the sacrificial layer pattern 210 at the same time or in sequence.

The process (S100) of forming the sacrificial layer pattern 210 and the process (S200) of forming the cover part 120 are the same as portion of the above-described mother for manufacturing the thermal radiation body for cooling the heating element, and thus, their detailed description will be omitted. First, as illustrated in (a) of FIG. 10, the sacrificial layer pattern 210 may be formed on the substrate 10 by using a photolithography process, and then, the cover part 120 may be formed on the sacrificial layer pattern 210.

Next, the transfer film 220 is formed on the cover part 120 (S250). After the cover part 120 is formed, as illustrated in (c) of FIG. 10, the transfer film 220 may be formed on the cover part 120.

Next, the substrate 100 and the sacrificial layer pattern 210 are removed at the same time or in sequence (S350). For example, the substrate 100 and the sacrificial layer pattern 210 may be etched to be removed through a wet etching process. Here, after the substrate 100 and the sacrificial layer pattern 210 may be removed at the same time or in sequence, as illustrated in (d) of FIG. 10, the transfer film 220 may be stamped on the heating element 300 to transfer the first cover part 121 (i.e., a pattern unit) in which a pore part 110 is formed, thereby forming the pattern unit including the pore part 110 and the first cover part 121. Here, when the substrate 100 and the sacrificial layer pattern 210 are made of the same material, the substrate 100 and the sacrificial layer pattern 210 may be removed at the same time or in sequence. For example, the sacrificial layer pattern 210 made of an organic material may be formed on the organic substrate 100. Also, after the substrate 100 is removed by the wet etching, an outlet (or an inlet) through which the removed material of the sacrificial layer pattern 210 is discharged may be formed to liquefy and/or vaporize the sacrificial layer pattern 210 by heat treatment or the like, thereby removing the sacrificial layer pattern 210.

As described above, since the pattern unit constituted by the cover part and the pore part is formed on the heating element, the thermal radiation body radiates the heat transferred from the heating element, to the outside, due to the optical tunneling phenomenon and the resonant phenomenon, which occur in the pattern unit, thereby significantly increasing the emissivity of the heat emitted in the form of the radiation. Therefore, the heating element may be effectively cooled. That is, when the pattern unit is provided on the heating element, the emissivity may increase over the wide infrared wavelength band through the resonant effect and the tunneling effect of the light, which occur in the pattern unit. Also, two or more ceramic materials having different wavelength bands in which the absorptivity (or the emissivity) is maximized may be used to constitute the multilayered color part. As a result, the radiation efficiency in the wide wavelength band may be improved when compared to the case in which the cover part is formed by using one ceramic material. Also, the cover part and the pore part may be provided to realize the pattern unit having the thin thickness when compared to the case in which the medium for radiating energy having the form of light is provided in the ceramic-plate shape. Also, the pattern may be easily applied in the form of the adhesion film that is simply attached to the heating element due to the thin thickness thereof.

The term "~ on" used in the above description includes direct contact and indirect contact at a position that is opposite to an upper and lower portion. It is also possible to locate not only the entire upper surface or the entire lower surface but also the partial upper surface or the lower surface, and it is used in the mean that it is opposed in position or contact directly to upper or lower surface. Thus, "on the heating element" may be a surface (for example, the upper or lower surface) of the heating element or a surface of a component (layer) provided on the surface of the heating element.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present inventive concept shall be determined by the technical scope of the accompanying claims.

What is claimed is:

1. A thermal radiation body for cooling a heating element, the thermal radiation body comprising a pattern unit disposed on the heating element to radiation-release heat transferred from the heating element, to an outside,
    wherein the pattern unit comprises:
    a pore part disposed on the heating element; and
    a cover part of which at least a portion is thermally connected to the heating element and which covers the pore part,
    wherein the pore part is formed as an empty space or filled with a gas in the cover part, and wherein the pore part is isolated from the outside by the cover part so that an area of the pore part is defined by the cover part,
    wherein a wavelength radiation-emitted from the pattern unit is a middle-infrared wavelength,
    wherein the cover part is made of a ceramic material or a dielectric and has a thickness of 50 nm to $\lambda/n$, where $\lambda$ is a peak wavelength of light radiated from the pattern unit, and n is a refractive index of the cover part at the peak wavelength, and
    wherein the pore part and the cover part generate a resonance of the middle-infrared wavelength.

2. The thermal radiation body of claim 1, wherein the pattern unit is provided in the form of a plurality of unit patterns spaced apart from each other.

3. The thermal radiation body of claim 1, further comprising a reflection layer provided between a surface of the heating element and the pattern unit, to reflect light incident into the surface of the heating element from the outside.

4. The thermal radiation body of claim 1, further comprising an anti-reflection layer provided between a surface of the heating element and the pattern unit, to prevent reflection of light incident into the surface of the heating element from inside the heating element or the outside.

5. The thermal radiation body of claim 1, wherein the cover part comprises:
    a first cover part contacting the pore part; and
    a second cover part provided on the first cover part and made of a material different from that of the first cover part.

6. The thermal radiation body of claim 5, wherein the first cover part and the second cover part are made of ceramic materials having light absorptivity different from each other in a predetermined wavelength band.

7. The thermal radiation body of claim 1, further comprising a base layer provided on the pattern unit to support or protect the pattern unit.

8. The thermal radiation body of claim 1, wherein the pore part is formed by removing a sacrificial layer pattern covered by the cover part through heat treatment or wet etching.

9. An electronic device comprising:
    the thermal radiation body for cooling the heating element of claim 1; and
    the heating element, wherein the heating element is an electronic element.

10. The electronic device of claim 9, wherein the thermal radiation body for cooling the heating element is directly formed on the heating element or is attached to be fixed to the heating element.

11. The electronic device of claim 9, wherein the electronic element comprises a light receiving element, and
    the cover part is transmissive with respect to a wavelength band of light absorbed by the light receiving element.

12. The electronic device of claim 9, wherein the electronic element comprises a light emitting element, and
    the cover part is transmissive with respect to a wavelength band of light emitted from the light emitting element.

* * * * *